United States Patent
Kim

[19]

[11] Patent Number: 6,121,834

[45] Date of Patent: Sep. 19, 2000

[54] SIGNAL COMPRESSING APPARATUS

[75] Inventor: Seong Ryeol Kim, Kyongsangbuk-do, Rep. of Korea

[73] Assignee: LG Semicon Co., Ltd., Chungcheongbuk-Do, Rep. of Korea

[21] Appl. No.: 09/286,435

[22] Filed: Apr. 6, 1999

[30] Foreign Application Priority Data

Jun. 12, 1998 [KR] Rep. of Korea ............................ 22019

[51] Int. Cl.⁷ ..................................................... H03G 3/20
[52] U.S. Cl. ........................................... 330/129; 330/140
[58] Field of Search ..................................... 330/129, 140, 330/141, 279, 281, 289

[56] References Cited

U.S. PATENT DOCUMENTS

| | | | |
|---|---|---|---|
| 3,904,971 | 9/1975 | Delagrange | 330/29 |
| 4,114,115 | 9/1978 | Minnis | 333/14 |
| 5,043,672 | 8/1991 | Youn | 330/129 |
| 5,604,924 | 2/1997 | Yokoya | 455/68 |
| 5,764,106 | 6/1998 | Deen et al. | 330/279 |
| 5,796,309 | 8/1998 | Nguyen | 330/289 |
| 5,844,444 | 12/1998 | Wu et al. | 330/279 |

*Primary Examiner*—Robert Pascal
*Assistant Examiner*—Henry Choe
*Attorney, Agent, or Firm*—Morgan, Lewis & Bockius LLP

[57] ABSTRACT

A signal compressing apparatus is disclosed, which controls output signal in case of exceeding input signal to increase transmission efficiency and obtains stable output due to temperature compensation. The signal compressing apparatus includes an amplifier for amplifying an input signal applied through an input resistor connected to an input terminal at a constant gain, and a gain controller for rectifying only a specific band signal of output signals of the amplifier between the input terminal of the amplifier and an output terminal thereof, compensating temperature of the rectified signal, and outputting a control signal to allow the gain of the amplifier to be constant.

13 Claims, 3 Drawing Sheets

SIGNAL COMPRESSING APPARATUS

BACKGROUND OF THE INVENTION

1. Field of the Invention

The present invention relates to a signal compression, and more particularly, to a signal compressing apparatus which controls output signal level depending on input signal level to increase transmission efficiency.

2. Discussion of the Related Art

A background art signal compressing apparatus will be described with reference to the accompanying drawing.

FIG. 1 is a block diagram illustrating a background art signal compressing apparatus.

As shown in FIG. 1, the background art signal compressing apparatus includes a resistor 11, an operational (OP) amplifier 12, and a gain controller 13.

The resistor 11 is connected between an input terminal 14 and an input terminal of the OP amplifier 12. The output of the OP amplifier 12 is connected to an output terminal 15.

The gain controller 13 is a feedback path of the OP amplifier 12 and is connected between the input of the OP amplifier 12 and the output thereof.

The gain controller 13 includes a resistor 13a, a capacitor 13b, a rectifier 13c, a band pass filter 13d, and an operational transconductance amplifier (OTA) 13e.

The band pass filter 13d is connected between the output of the OP amplifier 12 and the input of the rectifier 13c.

The output of the band pass filter 13d is connected to the input of the rectifier 13c, and the resistor 13a and the capacitor 13b are connected to the output of the rectifier 13c. Also, the output of the rectifier 13c is connected to the input of the OTA 13e.

The output of the OP amplifier 12 and the output of the rectifier 13c are input to the OTA 13e. The OTA 13e is connected to the input (current summing node) of the OP amplifier 12.

The operation of the aforementioned background art signal compressing apparatus will be described below.

As shown in FIG. 1, an audio input signal transmits current corresponding to an input signal to the current summing node, which is the input of the OP amplifier 12, through the resistor 11. The gain controller 13 forms a feedback path of the OP amplifier 12. The gain of the gain controller 13 is determined by ratio of effective resistor and the input resistor 11. Therefore, the effective resistor value of the gain controller 13 is controlled to be a gain predetermined by the size of the output.

The size of the output signal can be varied depending on the size of the input signal by controlling the effective resistor value of the gain controller in advance depending on the size of the output.

The band pass filter 13d of the gain controller 13 serves to limit the frequency range of the output signal.

At this time, the minimum cut-off frequency and the maximum cut-off frequency of the band pass filter 13d are set as the value for increasing signal-to-noise ratio of the signal compressing apparatus. Also, the minimum cut-off frequency and the maximum cut-off frequency are set in order to improve rectifying characteristic of signal by RC time constant of the capacitor 13b and the resistor 13a.

The rectifier 13c rectifies the output signal of the OP amplifier 12 passing through the band pass filter 13d using RC time constant by the resistor 13a and the capacitor 13b.

At this time, DC signal passing through the rectifier 13c is input to the OTA 13e.

Therefore, the OTA 13e varies its gain by the input DC signal. Thus, the output of the OP amplifier 12 is converted to current depending on the varied gain of the OTA 13e while passing through the OTA 13e, so that it is transmitted to the current summing node, i.e., the input of the OP amplifier 12.

However, in the background art signal compressing apparatus, although there is provided a filter at a feedback path of the OP amplifier to improve noise characteristic and a signal suitable for time constant of the rectifier to improve rectifying characteristic, the background art signal compressing apparatus has several problems.

First, if exceeding input signal is applied, the output of the OP amplifier becomes exceeding, thereby causing distortion of the output signal at low voltage operation.

Second, if the size of the output becomes larger in order to improve signal transmission efficiency, dynamic range of transmission increases, thereby reducing transmission efficiency.

Finally, if there is provided an automatic level controller (ALC) in order to above problems, temperature characteristic of rectifying voltage is sensitive to affect the output signal, so that it is impossible to obtain stable output.

SUMMARY OF THE INVENTION

Accordingly, the present invention is directed to a signal compressing apparatus that substantially obviates one or more of the problems due to limitations and disadvantages of the related art.

An object of the present invention is to provide a signal compressing apparatus which controls output signal in case of exceeding input signal to increase transmission efficiency and obtains stable output due to temperature compensation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a signal compressing apparatus according to the present invention includes an amplifier for amplifying an input signal applied through an input resistor connected to an input terminal at a constant gain, and a gain controller for rectifying only a specific band signal of output signals of the amplifier between the input terminal of the amplifier and an output terminal thereof, compensating temperature of the rectified signal, and outputting a control signal to allow the gain of the amplifier to be constant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
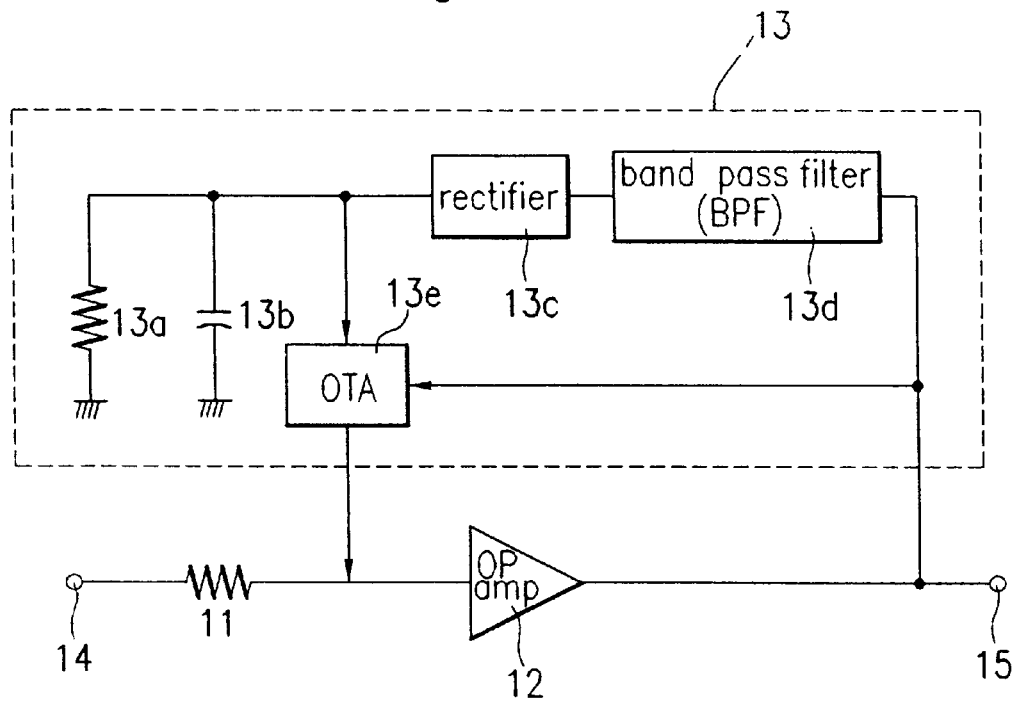
FIG. 1 is a block diagram illustrating a background art signal compressing apparatus.
Figure 2:
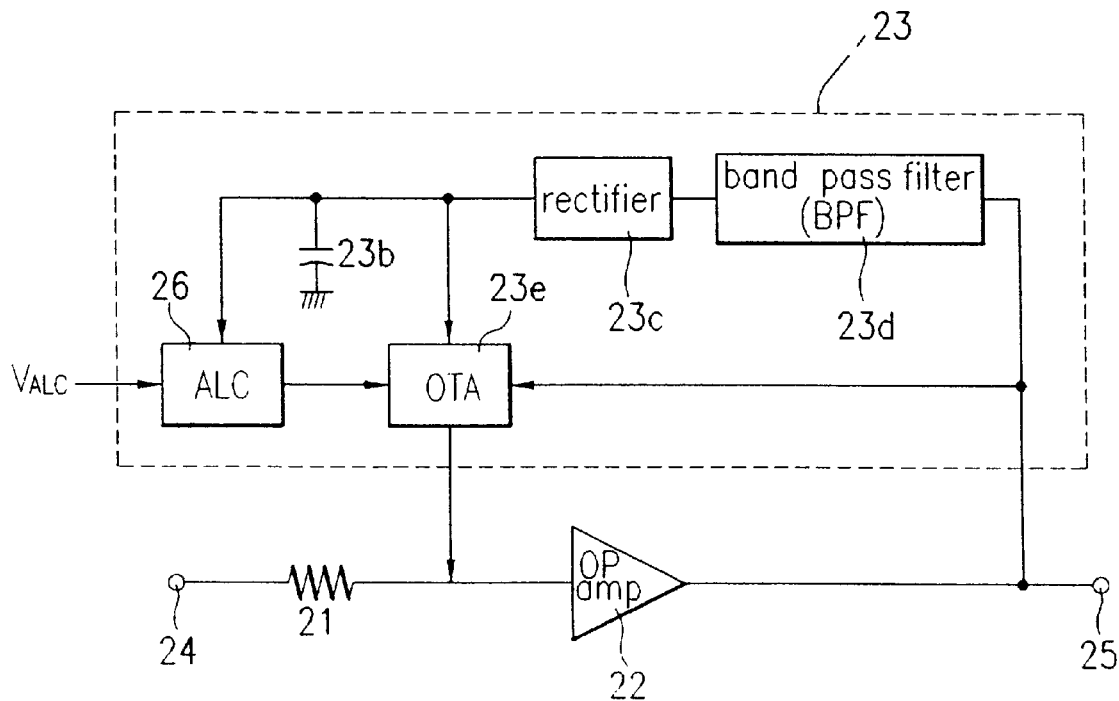
FIG. 2 is a block diagram illustrating a signal compressing apparatus according to the present invention.

As shown in FIG. 2, a signal compressing apparatus according to the present invention includes an input resistor 21, an operational (OP) amplifier 22 connected to the input resistor 21 in series, for amplifying input signal at a constant gain, a band pass filter 23d for outputting only a specific band signal from the output of the OP amplifier 22, a rectifier 23c for rectifying the output signal of the band pass filter 23d, an automatic level controller 26 for comparing the rectified voltage with a reference voltage to limit the output signal of the OP amplifier 22 against exceeding input signal and outputting a first control signal for controlling the gain of the OP amplifier 22 through temperature compensation when limiting the output signal, and an operational transconductance amplifier (OTA) 23e whose gain is determined by the first control signal, for outputting a second control signal to the input terminal of the OP amplifier 22 to allow the OP amplifier 22 to amplify the input signal at a constant gain.

The input resistor 21 is connected between an input terminal 24 and the input (current summing node) of the OP amplifier 22.

The gain controller 23 is a feedback path of the OP amplifier 22 and is connected between the input of the OP amplifier 22 and the output thereof.

The gain controller 23 includes a rectifier 23c, a band pass filter 23d, an OTA 23e, an automatic level controller (ALC) 26, and a capacitor 23b.

The band pass filter 23d is connected between the output of the OP amplifier 22 and the input of the rectifier 23c. The input terminal of the rectifier 23c is connected to the output of the band pass filter 23d and the output terminal thereof is connected to the input terminal of the ALC 26.

The output of the rectifier 23c and externally applied $V_{ALC}$ are input to the ALC 26. The output of the ALC 26 is connected to the input of the OTA 23e.

The OTA 23e is connected to the output of the OP amplifier 22, and the output of the OTA 23e is connected to the input of the OP amplifier 22, that is, current summing node, using the output of the ALC 26 as a control signal.

The ALC 26 includes a temperature compensated current mirror for inputting the output of the rectifier 23c and a comparator for comparing the output of the current mirror with the externally applied $V_{ALC}$ to output a control current for controlling the OTA 23e.

Figure 3:
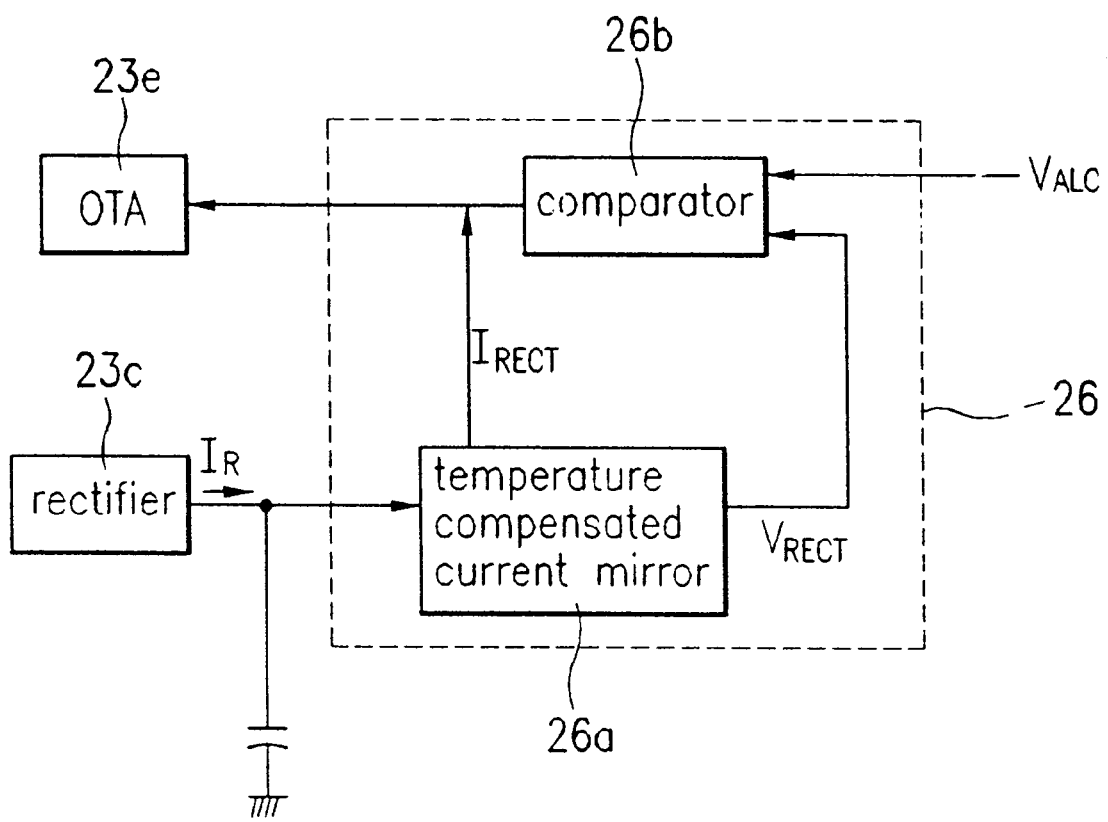
FIG. 3 is a detailed block diagram illustrating each element of a signal compressing apparatus according to the present invention.

FIG. 3 is a block diagram of the ALC according to the present invention.

As shown in FIG. 3, the ALC 26 includes a temperature compensated current mirror 26a and a comparator 26b.

The temperature compensated current mirror 26a outputs rectifying current $I_{RECT}$ and rectifying voltage $V_{RECT}$ which are proportional to the size of the input signal. The rectifying current $I_{RECT}$ is input to the OTA 23e and the rectifying voltage $V_{RECT}$ is input to the comparator 26b to be compared with the reference voltage $V_{ALC}$.

The comparator 26b compares the rectifying voltage $V_{RECT}$ from the temperature compensated current mirror 26a with the reference voltage $V_{ALC}$ and then outputs a control current $I_{ALC}$ which is proportional to the difference between the rectifying voltage $V_{RECT}$ and the reference voltage $V_{ALC}$.

The control current $I_{ALC}$ output from the comparator 26b controls the size of the rectifying current $I_{RECT}$ which is output from the temperature compensated current mirror 26a and input to the OTA 23e.

Therefore, the rectifying current input to the OTA 23e is determined by the control current output from the comparator 26b, so that the gain of the OTA 23e is finally determined.

Figure 4A:
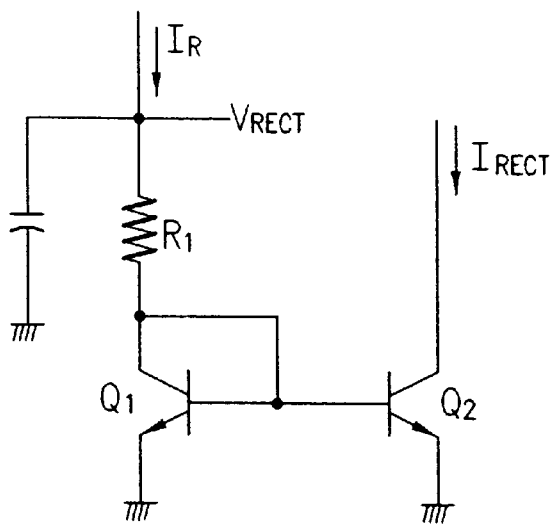
FIG. 4a is a circuit diagram illustrating a background art current mirror.
Figure 4B:
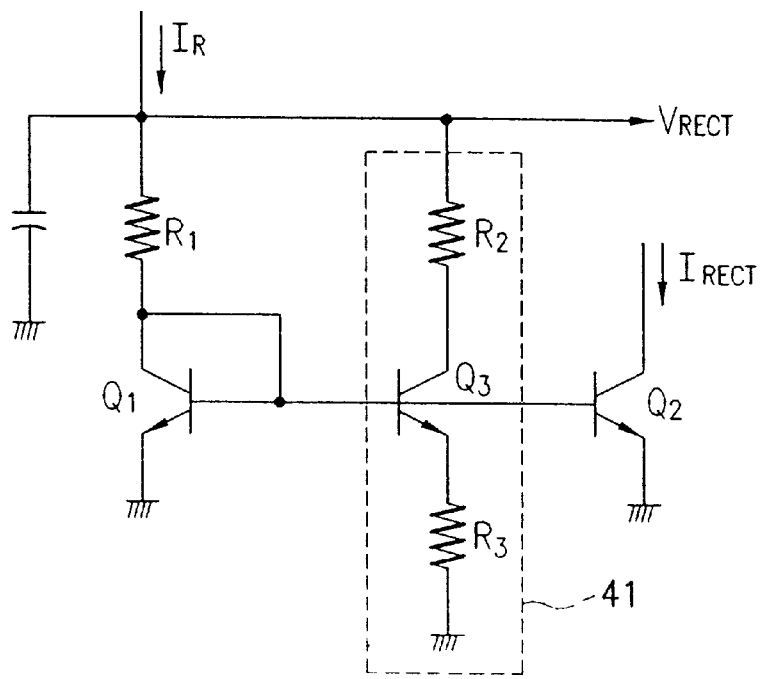
FIG. 4b is a circuit diagram illustrating a current mirror according to the present invention.

Meanwhile, FIG. 4a is a circuit diagram of the current mirror according to the background art and FIG. 4b is a circuit diagram of the temperature compensated current mirror according to the present invention.

The background art current mirror of FIG. 4a has little variation in temperature and thus has stable output. However, the rectifying voltage $V_{RECT}$ which serves as the input of the comparator is varied in temperature by a resistor R1 and $V_{BE}$ voltage (voltage between base and emitter) of a transistor Q1 and thus has variable output.

On the other hand, the temperature compensated current mirror of the present invention, as shown in FIG. 4b, combines a resistor R1 which varies the output due to temperature variation with a temperature compensator 41 consisting of resistors R2 and R3 and a transistor Q3 which allow $V_{BE}$ of a transistor Q1 to offset temperature.

In other words, there is provided a temperature compensator 41 consisting of a resistor R2, a transistor Q3 and a resistor R3 connected in series between two transistors Q1 and Q2 of the background art current mirror consisting of two transistors Q1 and Q2 and a resistor R1.

In the transistor Q3 of the temperature compensator 41, an emitter is connected to a ground terminal through the resistor R3 and a collector is connected to the rectifying voltage $V_{RECT}$ terminal applied to the comparator 26b through the resistor R2.

Therefore, the temperature increased by the transistor Q1 is offset by the transistor Q3 so that the temperature compensated rectifying voltage $V_{RECT}$ is finally applied to the comparator 26b.

Consequently, it should be noted that the rectifying voltage $V_{RECT}$ input to the comparator has no relation with temperature.

The operation of the aforementioned signal compressing apparatus will be described below.

As shown in FIG. 2, an input audio signal is input to the OP amplifier 22 through the resistor 21. The input of the OP amplifier 22 becomes the current summing node of the feedback path of the input signal.

The gain controller 23 serves as the feedback path of the OP amplifier 22. The gain of the OP amplifier 22 is determined by ratio of effective resistor of the feedback path and the input resistor 21.

To improve signal-to-noise ratio of the signal compressing circuit, the band pass filter 13d passes through only a specific band signal of the output signals of the OP amplifier 22.

The rectifier 23c which is a full-wave rectifier rectifies the output signal of the band pass filter 23d.

At this time, the rectifier 23c is rectified to DC current corresponding to the input signal. This rectifying current $I_R$ is input to the ALC 26.

If the rectifying current $I_R$ is input to the ALC 26, the temperature compensated current mirror 26a outputs the rectifying current $I_{RECT}$ to the OTA 23e and outputs the rectifying voltage $V_{RECT}$ corresponding to the rectifying current $I_{RECT}$ to the comparator 26b.

The comparator 26b compares the rectifying voltage $V_{RECT}$ input from the temperature compensated current mirror 26a with the externally applied reference voltage $V_{ALC}$ and outputs a control current $I_{ALC}$, which is proportional to the difference between the rectifying voltage $V_{RECT}$ and the reference voltage $V_{ALC}$, to the OTA 23e.

Therefore, the combination of the control current $I_{ALC}$ output from the comparator 26b and the rectifying current $I_{RECT}$ output from the temperature compensated current mirror 26a is input to the OTA 23e.

In other words, the gain of the OTA 23e is controlled by two currents ($I_{RECT}+I_{ALC}$).

The operation of the comparator 26b will be described in detail.

The comparator 26b compares $V_{RECT}$ with $V_{ALC}$. If the reference voltage $V_{ALC}$ is greater than the rectifying voltage $V_{RECT}/V_{ALC}>V_{RECT}$), the control current $I_{ALC}$ output from the comparator 26b becomes 0. On the other hand, if the reference voltage $V_{ALC}$ is smaller than the rectifying voltage $V_{RECT}$ ($V_{ALC} \leq V_{RECT}$), the control current $I_{ALC}$ output from the comparator 26b controls the size of the rectifying current ($I_{RECT}+I_{ALC}$) which is output from the temperature compensated current mirror 26a and input to the OTA 23e.

Thus, instead of the current corresponding to the increased rectifying voltage $V_{RECT}$, the current $I_{ALC}$ of the ALC 26 occurs, thereby resulting in that increase of the rectifying current $I_{RECT}$ due to increase of the input signal does not occur.

As a result, the effective resistor of the feedback path is maintained as it is because the rectifying current $I_{RECT}$ does not increase. Thus, the gain of the OTA 23e becomes constant. For this reason, exceeding output depending on exceeding input signal does not occur, thereby obtaining stable output.

As aforementioned, the signal compressing apparatus of the present invention has the following advantages.

First, since exceeding output depending on exceeding input signal is limited, distortion of the output signal does not occur at low voltage operation and transmission efficiency is improved. In addition, since the output is limited regardless of temperature variation, it is possible to obtain stable output.

It will be apparent to those skilled in the art that various modifications and variations can be made in the signal compressing apparatus according to the present invention without departing from the spirit or scope of the invention. Thus, it is intended that the present invention covers the modifications and variations of the invention provided they come within the scope of the appended claims and their equivalents.

What is claimed is:

1. A signal compressing apparatus comprising:
   an amplifier for amplifying an input signal applied through an input resistor at a constant gain; and
   a gain controller for rectifying only a specific band signal of output signals of the amplifier between an input terminal of the amplifier and an output terminal thereof, compensating temperature of the rectified signal, and outputting a control signal to allow the gain of the amplifier to be constant, wherein the gain controller includes a current mirror which can be compensated for temperature variations.

2. A signal compressing apparatus comprising:
   an input resistor connected to an input terminal;
   an operational amplifier connected to the input resistor in series, for amplifying an input signal at a constant gain;
   a filter for outputting only a specific band signal from output signals of the operational amplifier;
   a rectifier for rectifying an output signal of the filter;
   a first gain controller for comparing a rectified signal with a reference signal to limit the output signals of the operational amplifier against exceeding the input signal and outputting a first control signal for controlling a gain of the operational amplifier through temperature compensation, wherein the first gain controller includes a current mirror; and
   a second gain controller whose gain is determined by the first control signal, for outputting a second control signal to the input terminal of the operational amplifier to allow the operational amplifier to amplify the input signal at a constant gain.

3. The signal compressing apparatus as claimed in claim 2, wherein the first gain controller includes the current mirror for outputting the output signal of the rectifier through temperature compensation and a comparator for comparing the output signal of the temperature compensated current mirror with the reference signal to output a third control signal for controlling a size of the first control signal.

4. The signal compressing apparatus as claimed in claim 2, wherein the filter is a band pass filter.

5. The signal compressing apparatus as claimed in claim 3, wherein the reference signal is externally applied.

6. The signal compressing apparatus as claimed in claim 3, wherein the comparator does not output the third control signal if the reference signal is greater than the output signal of the current mirror, and outputs the third control signal if the reference signal is smaller than or identical with the output signal of the current mirror so as to control the size of the first control signal.

7. The signal compressing apparatus as claimed in claim 3, wherein the current mirror includes:
   a first transistor whose emitter is connected to a ground terminal and base and collector are in common connected to the output terminal of the rectifier through a first resistor;
   a second transistor whose emitter is connected to the ground terminal, base is in common connected to the base of the first transistor, and collector is connected to a rectifying current; and
   a temperature compensator whose emitter is connected to the ground terminal through a second resistor between the base of the first transistor and the base of the second transistor and collector is in parallel connected to an input terminal of the first resistor through a third resistor, so as to offset temperature increased by the first transistor.

8. The signal compressing apparatus as claimed in claim 7, wherein the current mirror outputs a rectifying voltage $V_{RECT}$ to the comparator and outputs a rectifying current $I_{RECT}$ to the second gain controller.

9. A signal compressing apparatus comprising:
   an operational amplifier for amplifying an input signal at a constant gain;

a filter connected to the operational amplifier for outputting only a specific band signal;

a rectifier connected to the filter for receiving the specific band signal and generating a rectified signal;

a first gain controller for comparing the rectified signal with a reference signal to limit an output signal of the operational amplifier against exceeding the input signal and generating a first control signal for controlling a gain of the operational amplifier through temperature compensation wherein the first gain controller includes a current mirror; and a second gain controller whose gain is determined by the first control signal for receiving the output signal from the operational amplifier and the first control signal from the first gain controller and outputting a second control signal to an input terminal of the operational amplifier, thus allowing the operational amplifier to amplify the input signal at a constant gain.

10. The signal compressing apparatus as claimed in claim 9, wherein the first gain controller includes a current mirror for outputting the rectified signal through temperature compensation.

11. The signal compressing apparatus as claimed in claim 10, wherein the first gain controller further includes a comparator for comparing an output signal of the current mirror with the reference signal, thus outputting a third control signal for controlling a value of the first control signal.

12. The signal compressing apparatus as claimed in claim 11, wherein the comparator does not output the third control signal if the reference signal is greater than the output signal of the current mirror, and outputs the third control signal if the reference signal is smaller than or identical to the output signal of the current mirror.

13. The signal compressing apparatus as claimed in claim 10, wherein the current mirror includes:

a first transistor whose emitter is connected to a ground terminal, base and collector are in common connected to the output terminal of the rectifier through a first resistor;

a second transistor whose emitter is connected to the ground terminal, base is in common connected to the base of the first transistor, and collector is connected to a rectifying current; and a temperature compensator whose emitter is connected to the ground terminal through a second resistor between the base of the first transistor and the base of the second transistor and collector is in parallel connected to an input terminal of the first resistor through a third resistor, so as to offset temperature increased by the first transistor.

* * * * *